United States Patent
Wells et al.

(10) Patent No.: US 8,962,431 B2
(45) Date of Patent: *Feb. 24, 2015

(54) METHODS OF FORMING METAL SILICIDE-COMPRISING MATERIAL AND METHODS OF FORMING METAL SILICIDE-COMPRISING CONTACTS

(71) Applicant: Micron Technology, Inc., Boise, ID (US)

(72) Inventors: David H. Wells, Boise, ID (US); John Mark Meldrim, Boise, ID (US); Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/157,192

(22) Filed: Jan. 16, 2014

(65) Prior Publication Data

US 2014/0134816 A1    May 15, 2014

Related U.S. Application Data

(63) Continuation of application No. 13/174,466, filed on Jun. 30, 2011, now Pat. No. 8,728,930.

(51) Int. Cl.

| H01L 21/336 | (2006.01) |
| H01L 21/28 | (2006.01) |
| H01L 21/285 | (2006.01) |
| H01L 21/3213 | (2006.01) |
| H01L 21/283 | (2006.01) |

(52) U.S. Cl.
CPC .... *H01L 21/28097* (2013.01); *H01L 21/28518* (2013.01); *H01L 21/32134* (2013.01); *H01L 21/32139* (2013.01); *H01L 21/283* (2013.01)

USPC .......... 438/299; 438/584; 438/592; 438/622; 438/682; 257/E21.593; 257/E21.409

(58) Field of Classification Search
None
See application file for complete search history.

(56) References Cited

U.S. PATENT DOCUMENTS

| 6,025,267 A | 2/2000 | Pey et al. |
| 6,177,319 B1 | 1/2001 | Chen |
| 6,329,287 B1 | 12/2001 | Gadepally |
| 6,362,095 B1 | 3/2002 | Woo et al. |
| 6,475,893 B2 | 11/2002 | Giewont et al. |

(Continued)

FOREIGN PATENT DOCUMENTS

WO    WO 2010/046881    4/2010

*Primary Examiner* — Charles Garber
*Assistant Examiner* — Abdulfattah Mustapha
(74) *Attorney, Agent, or Firm* — Wells St. John, P.S.

(57) ABSTRACT

A method of forming metal silicide-comprising material includes forming a substrate which includes a first stack having second metal over first metal over silicon and a second stack having second metal over silicon. The first and second metals are of different compositions. The substrate is subjected to conditions which react the second metal with the silicon in the second stack to form metal silicide-comprising material from the second stack. The first metal between the second metal and the silicon in the first stack precludes formation of a silicide comprising the second metal and silicon from the first stack. After forming the metal silicide-comprising material, the first metal, the second metal and the metal silicide-comprising material are subjected to an etching chemistry that etches at least some remaining of the first and second metals from the substrate selectively relative to the metal silicide-comprising material.

27 Claims, 5 Drawing Sheets

(56) References Cited

U.S. PATENT DOCUMENTS

| | | |
|---|---|---|
| 6,784,098 B1 | 8/2004 | Lou |
| 6,916,729 B2 | 7/2005 | Fang et al. |
| 6,949,482 B2 | 9/2005 | Murthy et al. |
| 8,008,177 B2 | 8/2011 | San et al. |
| 8,598,033 B1 | 12/2013 | Lai et al. |
| 8,728,930 B2 * | 5/2014 | Wells et al. .................. 438/622 |
| 2007/0048932 A1 * | 3/2007 | Collins et al. ................ 438/253 |
| 2009/0053883 A1 | 2/2009 | Colombo et al. |
| 2009/0075466 A1 | 3/2009 | Ho et al. |
| 2010/0078733 A1 * | 4/2010 | Masuoka et al. ............. 257/384 |

* cited by examiner

METHODS OF FORMING METAL SILICIDE-COMPRISING MATERIAL AND METHODS OF FORMING METAL SILICIDE-COMPRISING CONTACTS

RELATED PATENT DATA

This patent resulted from a continuation application of U.S. patent application Ser. No. 13/174,466, filed Jun. 30, 2011, entitled "Methods of Forming Metal Silicide-Comprising Material and Methods of Forming Metal Silicide-Comprising Contacts", naming David H. Wells, John Mark Meldrim, and Rita J. Klein as inventors, the disclosure of which is incorporated by reference.

TECHNICAL FIELD

Embodiments disclosed herein pertain to methods of forming metal silicide-comprising material.

BACKGROUND

Conductive metal silicides have been used in the fabrication of device components of integrated circuitry. As an example, such may be used to form highly conductive electrical contacts between semiconductor devices and supporting interconnect structures.

One manner of forming metal silicides is to deposit metal into contact with silicon and thereafter heating such materials to cause the metal to react with the silicon and form a low-resistance metal silicide. For example, a thin metal may be deposited over patterned semiconductor devices (e.g., field effect transistors) and over dielectric material such as silicon dioxide and silicon nitride. The materials are then heated which causes a reaction of the silicon of active regions of the semiconductor device, but not with the silicon dioxide or silicon nitride dielectrics. Following the reaction, the un-reacted metal may be removed by chemical etching, leaving conductive metal silicide contacts only over active device regions.

In some instances, it is desirable to form metal silicide with silicon over only some active areas of a substrate and not over others.

DETAILED DESCRIPTION OF EXAMPLE EMBODIMENTS

Figure 1:
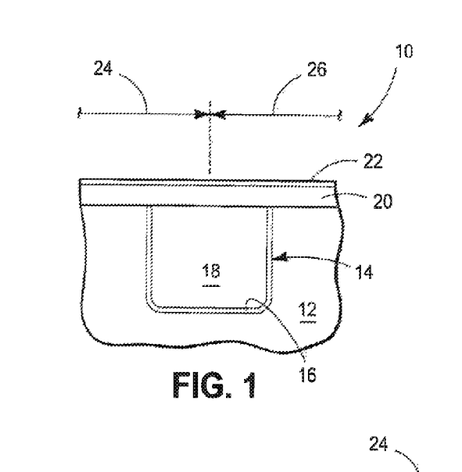
FIG. 1 is a diagrammatic sectional view of a substrate fragment in process in accordance with an embodiment of the invention.

Example methods of forming metal silicide-comprising material are initially described with reference to FIGS. 1-8. Referring to FIG. 1, an example substrate fragment 10 includes silicon material 12 having a dielectric isolation region 14 formed therein. Silicon 12 may be homogenous or non-homogenous. An elevationally outer portion of silicon 12 may be elemental-form silicon, for example a bulk monocrystalline silicon substrate within which isolation region 14 has been formed. Substrate 10 may be considered as having a first substrate area 24 where metal silicide-comprising material is to be formed with silicon 12 and a second substrate area 26 where metal silicide-comprising material is not to be formed with silicon 12.

Isolation region 14 has been formed within a trench in silicon 12, and includes a silicon nitride liner 16 and silicon dioxide material 18 thereover. A first metal 20 has been formed over silicon 12. An example thickness range for first metal 20 is from about 3 to 20 nanometers. First metal 20 may be homogenous or non-homogenous. First metal 20 may be one or more of a metal element, a mixture of metal elements, an alloy of different metal elements, or comprise a metal compound which includes one or more metal elements. Example metal compounds include metal nitrides, with titanium nitride, molybdenum nitride, and tungsten nitride being some specific examples. A specific example metal element is elemental tungsten. Other metal elements might alternately or additionally be used. In the context of this document, a metal element is an element within the latest IUPAC Groups 1-12 or aluminum.

In one embodiment, at least some of first metal 20 is directly against silicon 12. In this document, a material or structure is "directly against" another when there is at least some physical touching contact of the stated materials or structures relative one another. In contrast, "over" encompasses "directly against" as well as construction where intervening material(s) or structure(s) result(s) in no physical touching contact of the stated materials or structures relative one another.

First metal 20 may not be directly against silicon 12, for example having a thin (i.e., from about 0.5 nanometer to about 10 nanometers) dielectric (not shown) between silicon 12 and first metal 20. In one embodiment, such a thin dielectric may be from about 2 to 5 nanometers thick. Example materials include $SiO_2$, $Si_3N_4$, HfO, and ZrO, and the thin dielectric may be homogenous or non-homogenous. Such a thin dielectric may be etched away from region 24 during removal of the first metal 20 or may be removed in a pre-clean of the silicon 12. First metal 20 would protect the thin dielectric in un-patterned areas from any pre-clean. Some small amount of undercut may occur where the thin dielectric, when used, is laterally etched under the edges of the first metal. The thin dielectric may or may not be etched by etching chemistries used to etch first metal 20 and a second metal (described below).

In one embodiment, first metal 20 may also be over at least one of silicon dioxide or silicon nitride. In one embodiment, first metal 20 is directly against at least one of silicon dioxide or silicon nitride, for example directly against silicon nitride 16 and silicon dioxide 18 as shown.

In one embodiment and as shown, amorphous carbon 22 has been formed over first metal 20, for example to function as a hardmask. An example thickness range for amorphous carbon 22 is from about 3 to 300 nanometers. Substrate 10 is but one example substrate, with others being usable in accordance with embodiments of the invention.

Figure 2:
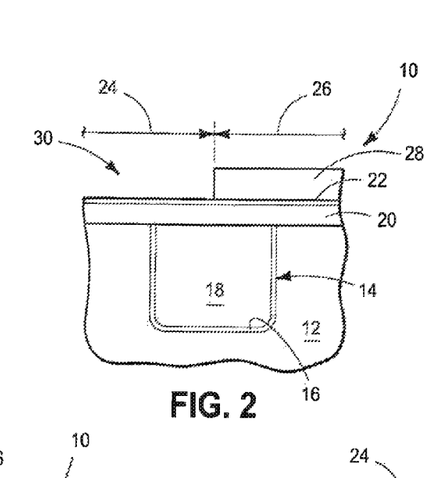
FIG. 2 is a view of the FIG. 1 substrate at a processing step subsequent to that shown by FIG. 1.

Referring to FIG. 2, a mask 28 has been formed over amorphous carbon 22 in second substrate area 26. Mask 28 may comprise photoresist, and is shown as being patterned to have an opening 30 there-through to amorphous carbon 22 in first substrate area 24. Mask 28 may be homogenous or non-homogenous, and may include one or more antireflective coating materials.

Figure 3:
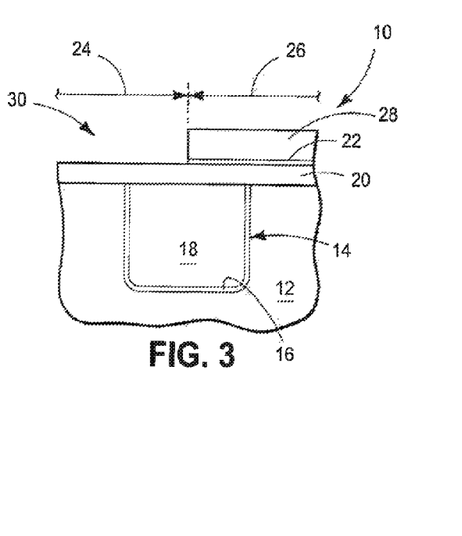
FIG. 3 is a view of the FIG. 2 substrate at a processing step subsequent to that shown by FIG. 2.

Referring to FIG. 3, amorphous carbon 22 has been removed from first area 24 through opening 30, for example by any suitable dry etch (e.g., using $O_2$) which may stop on first metal 20.

Figure 4:
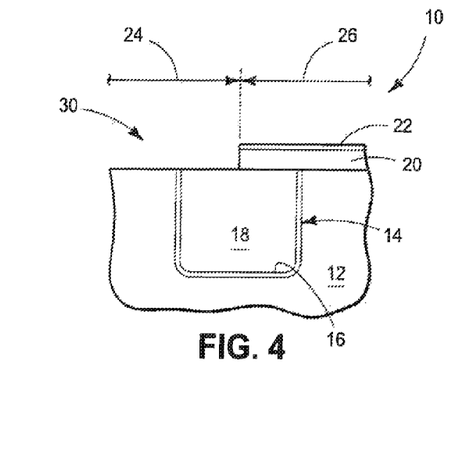
FIG. 4 is a view of the FIG. 3 substrate at a processing step subsequent to that shown by FIG. 3.

Referring to FIG. 4, at least some of first metal 20 has been removed from being over silicon 12 in first substrate area 24 while first metal 20 has been left covering over silicon 12 in second substrate area 26. In one embodiment the act of removing the first metal removes all such metal from being over silicon in the first substrate area. An example removing technique is by etching, for example either wet or dry chemical etching. In one embodiment, etching may be conducted to also etch away mask 28 (not shown) selectively relative to amorphous carbon 22 in second substrate area 26. In one embodiment, the etching removes the first metal selectively relative to the silicon, and in one embodiment selectively relative to any exposed silicon dioxide or silicon nitride. As an example where mask 28 comprises photoresist and first metal 20 comprises titanium nitride, these materials may be etched using a solution of $H_2SO_4$ and $H_2O_2$, and selectively relative to each of silicon, silicon nitride, and silicon dioxide. In the context of this document, a "selective etch" is an etch where one material is removed at a rate of at least 1.5:1 relative to another.

Figure 5:
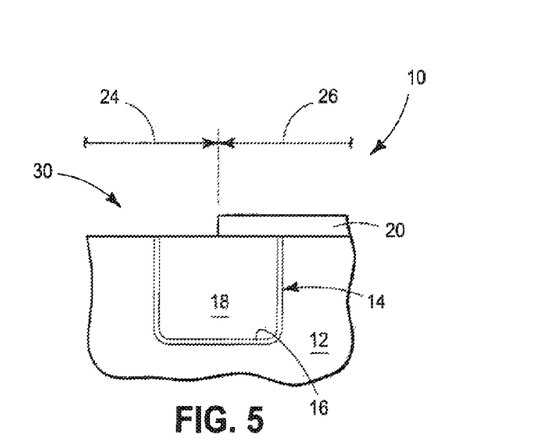
FIG. 5 is a view of the FIG. 4 substrate at a processing step subsequent to that shown by FIG. 4.

Referring to FIG. 5, all remaining of amorphous carbon 22 (not shown) has been removed in second substrate area 26.

Figure 6:
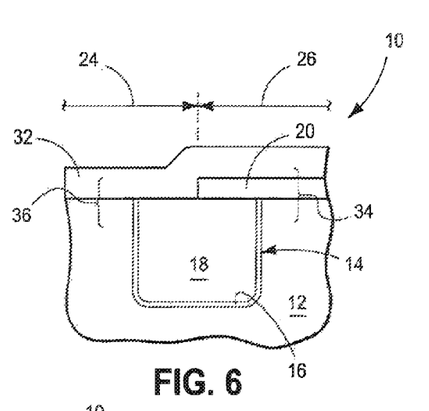
FIG. 6 is a view of the FIG. 5 substrate at a processing step subsequent to that shown by FIG. 5.

Referring to FIG. 6, a second metal 32 has been formed over first metal 20 in second substrate area 26 and over silicon 12 in first substrate area 24. The second metal is of different composition from that of the first metal. Nevertheless, second metal 32 may be one or more of a metal element, a mixture of metal elements, an alloy of different metal elements, or comprise a metal compound which includes one or more metal elements. The second metal may be homogenous or non-homogenous. An example thickness range for second metal 26 is from about 1 nanometer to about 50 nanometers. In one embodiment, the second metal comprises at least one of cobalt or nickel. Regardless, in one embodiment, the second metal is in elemental form. At least some of the second metal may be directly against silicon 12 in first substrate area 24. Alternately, second metal 32 may not be directly against silicon 12 within first substrate area 24, for example having a thin native oxide between second metal 32 and silicon 12. Second metal 32 may or may not be directly against first metal 20, and may or may not be directly against silicon dioxide 18 or silicon nitride 16. Second metal 32 may be covered by another material (not shown), which may be the first metal composition.

Any of the above substrates may be subjected to one or more cleaning or other treatment steps prior to the processing depicted by each figure. For example, any of the substrates might be subjected to intervening physical and/or chemical cleaning.

The above-described processing through FIG. 6 is but one example method of forming a substrate 10 comprising a first stack 34 which comprises second metal 32 over first metal 20 over silicon 12, and a second stack 36 which comprises second metal 32 over silicon 12. Substrate 10 is but only one example substrate having the just-described attributes including first and second stacks of such material, with other substrate also of course being usable.

Figure 7:
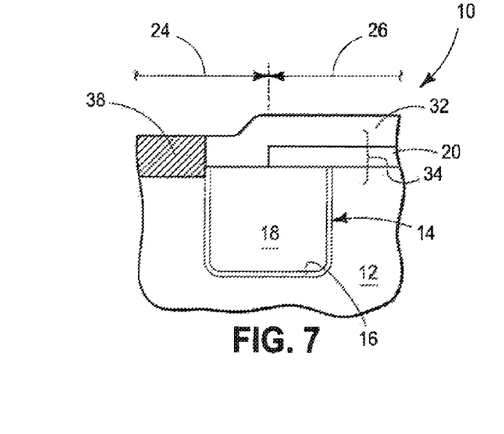
FIG. 7 is a view of the FIG. 6 substrate at a processing step subsequent to that shown by FIG. 6.

Referring to FIG. 7, the substrate of FIG. 6 has been subjected to conditions which react second metal 32 with silicon 12 in second stack 36 (not shown) in first substrate area 24 to form metal silicide-comprising material 38 from second stack 36. First metal 20 between second metal 32 and silicon 12 in first stack 34 in second substrate area 26 precludes formation of a silicide from second metal 32 and silicon 12 in first stack 34. Ideally, the subjecting of the substrate to such conditions does not form any metal silicide from materials of first stack 34. Further ideally, the conditions which form the silicide do not react the first metal with silicon nitride or silicon dioxide. If, as an example, a thin layer of native oxide (not shown) is between silicon 12 and second metal 32, reaction may still occur upon penetration of second metal through such oxide to the silicon. Regardless, example suitable conditions include subjecting substrate 10 to elevated temperature in an inert and/or reactive ambient for a sufficient period of time to form metal silicide-comprising material 38. Such may or may not transform all of second metal 32 over silicon 12 in first substrate area 24 to metal silicide. In one embodiment the conditions are at a temperature of 600° C. or less, in one embodiment at 500° C. or less, and in one embodiment at 400° C. or less. Regardless, silicide-comprising material 38 may be homogenous or non-homogenous.

As an example where first metal 20 comprises titanium nitride and second metal 32 comprises nickel, substrate 10 may be annealed at 300° C. for from about 15 seconds to two minutes in an inert atmosphere which will form nickel silicide-comprising material 38 but not react TiN metal 20 with silicon 12 to form a silicide. Where second metal 32 comprises elemental cobalt and first metal 20 comprises titanium nitride, the substrate may be annealed at from about 400° to about 600° C. for from 15 seconds to two minutes in an inert atmosphere to produce the example structure of FIG. 7. Regardless, the resultant silicide-comprising material 38 may or may not be in a desired finished form and/or electrical conductivity at this point in the process.

Metal silicide-comprising material 38 in one embodiment may be used as one or more metal silicide-comprising contacts to underlying substrate 12 which may, in one embodiment, comprise an activated source/drain region. For example, a conductively doped outer portion of silicon 12 may be subjected to an activation anneal at a temperature of greater than about 800° C. prior to forming silicide-comprising material 38.

Figure 8:
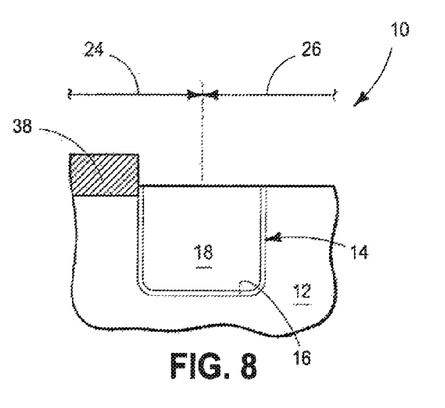
FIG. 8 is a view of the FIG. 7 substrate at a processing step subsequent to that shown by FIG. 7.

Referring to FIG. 8, first metal 20 (not shown), second metal 32 (not shown), and metal silicide-comprising material 38 have been subjected to an etching chemistry which has etched at least some remaining of the first and second metals (all, as shown) from the substrate selectively relative to metal silicide-comprising material 38. Such may also etch the first and second metals selectively relative to any exposed silicon dioxide and silicon nitride, and/or other material, as shown. In one embodiment, the etching chemistry is wet, and in one embodiment is acidic. As an example where first metal 20 comprises titanium nitride and second metal 32 comprises nickel or cobalt, an aqueous sulfuric acid solution with or without hydrogen peroxide will provide the structure of FIG. 8 from that of FIG. 7 when etching at a temperature of from about 80° C. to 180° C. at room ambient pressure. An additional example aqueous chemistry comprises a combination ammonium hydroxide and hydrogen peroxide.

If desired, the substrate of FIG. 8 may be annealed thereafter, for example to reduce the electrical resistance of metal silicide 38 as initially formed. An example anneal would be at a temperature of from 600° C. to 900° C. for from about 5 to 90 seconds. Any subsequent processing may be conducted to produce any desired structure.

Figure 9:
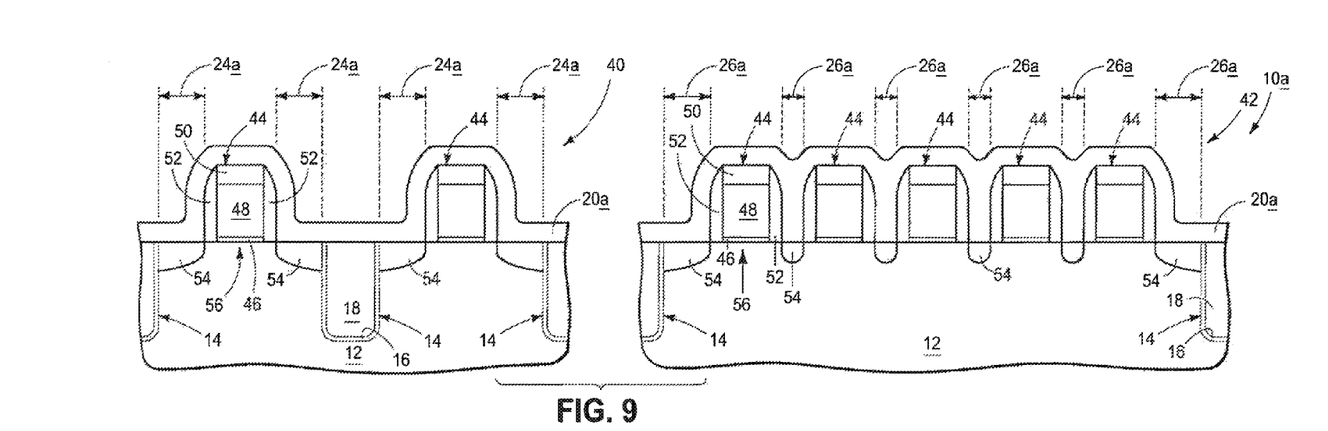
FIG. 9 is a diagrammatic sectional view of a substrate fragment in process in accordance with an embodiment of the invention.

Additional example embodiments of the invention are next described with reference to FIGS. 9-13 with respect to a substrate 10a. Like numerals from the first-described embodiments have been used where appropriate, with some construction differences being indicated with the suffix "a" or with different numerals. Referring to FIG. 9, substrate 10a is shown as comprising different left and right substrate fragments comprising a first set 40 and a second set 42 of laterally spaced transistor gate constructions 44. Such gate constructions may or may not be of the same configuration, and may or may not be equally spaced relative one another, within either set. Regardless, at least some immediately adjacent gate constructions 44 of first set 40 are spaced farther apart than at least some immediately adjacent gate constructions 44 of second set 42. Example gate constructions 44 are shown as comprising a gate dielectric 46, conductive gate material 48, a dielectric cap 50, and dielectric sidewall spacers 52. Alternate gate constructions may of course be used, for example constructions comprising programmable floating gates and control gates. Regardless, dielectric isolation regions 14 may be provided relative to silicon 12. Activated silicon-comprising source/drain regions 54 have been formed operatively adjacent the respective gate constructions 44 of the first and second sets 40, 42. Transistor channel regions 56 are within silicon 12 beneath gate constructions 44 between source/drain regions 54. Alternate transistor constructions may be used, whether planar (as shown) or non-planar (not shown). First metal 20a has been formed over source/drain regions 54. Substrate 10a may be considered as having first substrate area 24a where metal silicide-comprising material is to be formed with silicon 12 and second substrate area 26a where metal silicide-comprising material is not to be formed with silicon 12.

Figure 10:
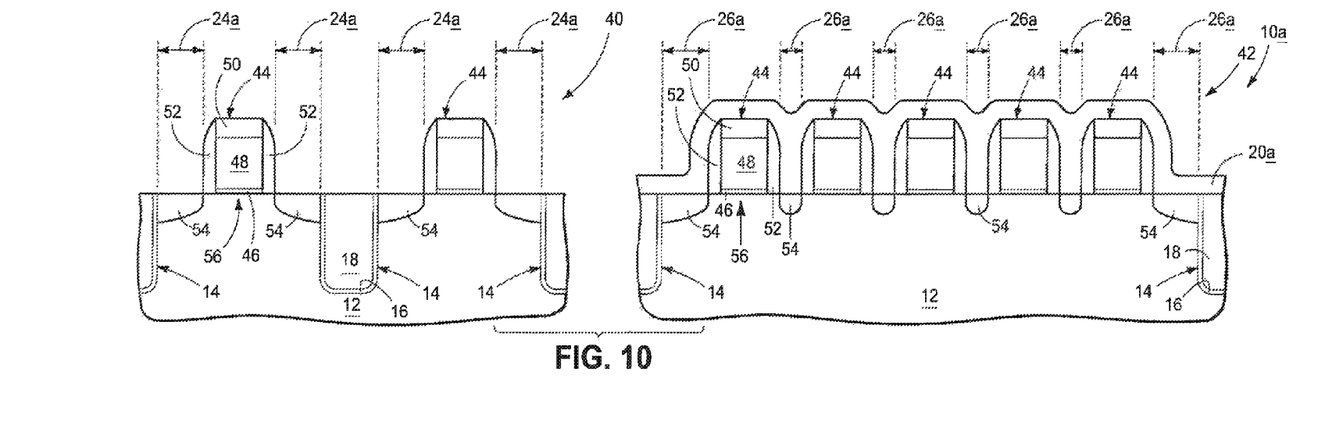
FIG. 10 is a view of the FIG. 9 substrate at a processing step subsequent to that shown by FIG. 9.

Referring to FIG. 10, first metal 20a has been removed from over source/drain regions 54 that are adjacent gate constructions 44 of first set 40. First metal 20a remains covering over source/drain regions 54 that are adjacent gate constructions 44 of second set 42.

Figure 11:
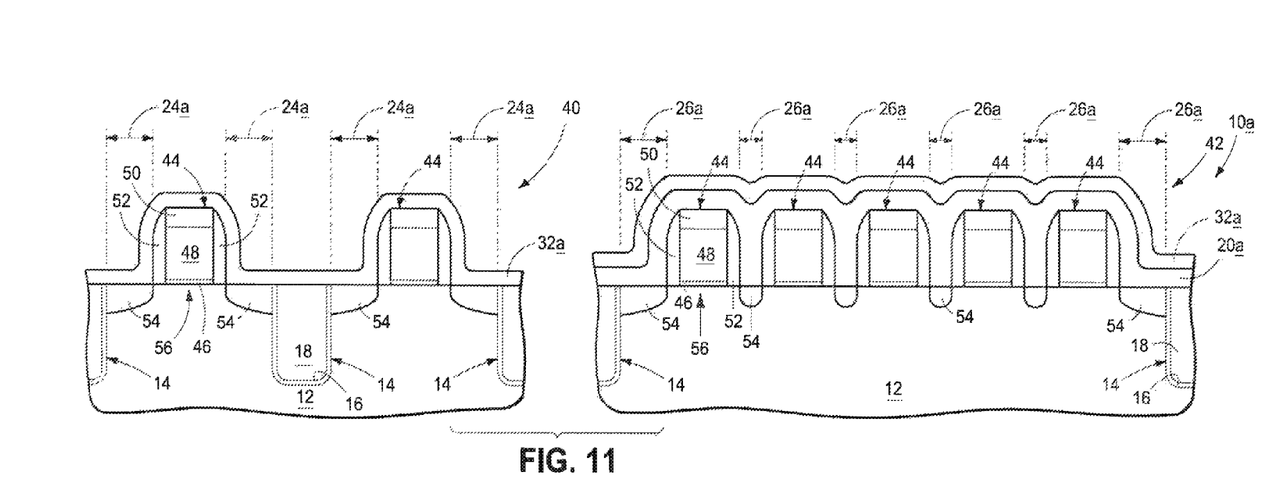
FIG. 11 is a view of the FIG. 10 substrate at a processing step subsequent to that shown by FIG. 10.

Referring to FIG. 11, second metal 32a has been formed over the first metal 20a that covers over source/drain regions 54 that are adjacent gate constructions 44 of second set 42. Second metal 32a has also been formed over source/drain regions 54 that are adjacent gate constructions 44 of first set 40. In one embodiment and as shown, first metal layer 20a may be formed thicker over source/drain regions 54 that are between immediately adjacent of gate constructions 44 of second set 42 than over source/drain regions 54 that are adjacent gate constructions 44 of first set 40.

Figure 12:
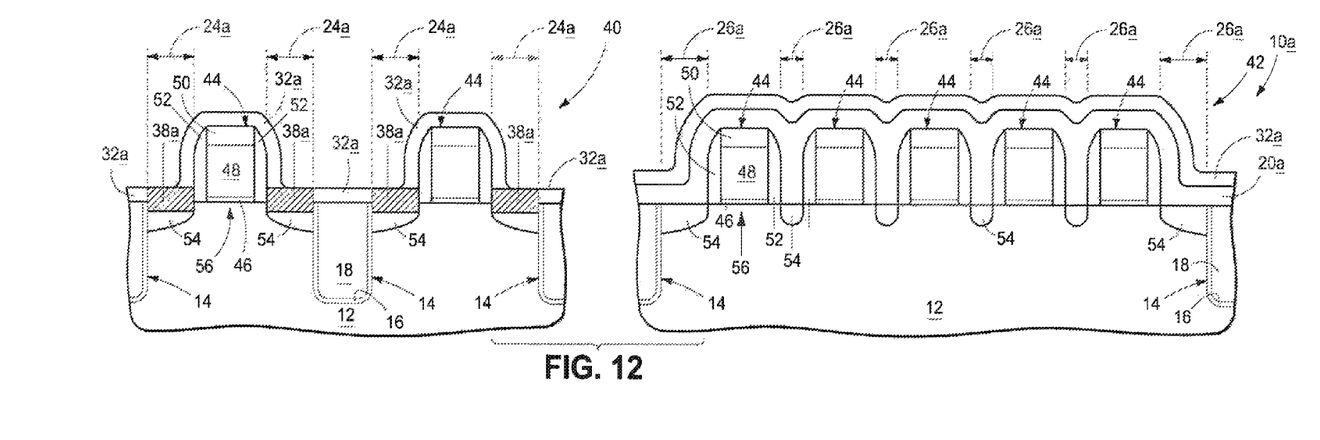
FIG. 12 is a view of the FIG. 11 substrate at a processing step subsequent to that shown by FIG. 11.

Referring to FIG. 12, substrate 10a of FIG. 11 has been subjected to conditions which react second metal 32a with silicon 12 of activated source/drain regions 54 that are adjacent gate constructions 44 of first set 40 to form metal silicide-comprising contacts 38a to such source/drain regions 54. The conditions do not form metal silicide-comprising contacts with first metal 20a and silicon 12 of source/drain regions 54 that are adjacent gate constructions 44 of second set 42.

Figure 13:
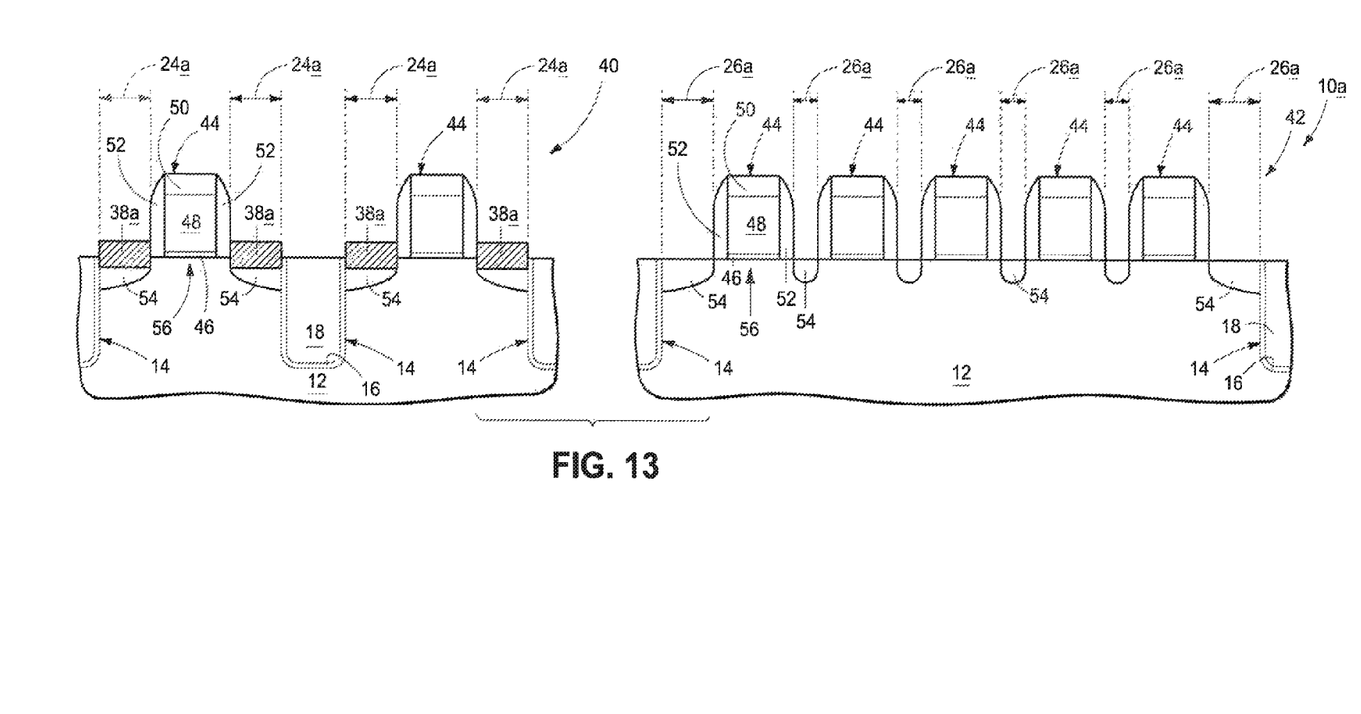
FIG. 13 is a view of the FIG. 12 substrate at a processing step subsequent to that shown by FIG. 12.

Referring to FIG. 13, first metal 20a (not shown), second metal 32a (not shown), and metal silicide-comprising contacts 38a have been subjected to a suitable etching chemistry that etches at least some remaining of the first and second metals (all, as shown) from the substrate selectively relative to metal silicide-comprising contacts 38.

Any of the processing and/or attributes as described above with respect to the processing and substrates of FIGS. 1-8 may be used in the example additional processing depicted in FIGS. 9-13.

CONCLUSION

In one embodiment, a method of forming metal silicide-comprising material includes forming a substrate which includes a first stack having second metal over first metal over silicon and a second stack having second metal over silicon. The first and second metals are of different compositions. The substrate is subjected to conditions which react the second metal with the silicon in the second stack to form metal silicide-comprising material from the second stack. The first metal between the second metal and the silicon in the first stack precludes formation of a silicide comprising the second metal and silicon from the first stack. After forming the metal silicide-comprising material, the first metal, the second metal and the metal silicide-comprising material are subjected to an etching chemistry that etches at least some remaining of the first and second metals from the substrate selectively relative to the metal silicide-comprising material.

In one embodiment, a method of forming metal silicide-comprising contacts includes forming a first metal over silicon of a substrate. At least some of the first metal is removed from being over the silicon in first substrate area where metal silicide-comprising contacts are to be formed with the silicon and is left covering over the silicon in second substrate area where metal silicide-comprising contacts are not to be formed with the silicon. A second metal is formed over the first metal in the second substrate area and over the silicon in the first substrate area. The second metal is of different composition from that of the first metal. The substrate is subjected to conditions which react the second metal with the silicon in the first substrate area to form metal silicide-comprising contacts in the first substrate area yet which do not form metal silicide-comprising contacts with the first metal and the silicon in the second substrate area. After forming the metal silicide-comprising contacts, the first metal, the second metal and the metal silicide-comprising contacts are subjected to an etching chemistry that etches at least some remaining of the first and second metals from the substrate selectively relative to the metal silicide-comprising contacts.

In one embodiment, a method of forming metal silicide-comprising contacts to transistor source/drain regions includes forming first and second sets of laterally spaced transistor gate constructions. Immediately adjacent gate constructions of the first set are spaced farther apart than immediately adjacent gate constructions of the second set. Activated silicon-comprising source/drain regions are formed operatively adjacent the respective gate constructions of the first and second sets. A first metal is formed over the source/drain regions that are adjacent the gate constructions of the first and second sets. The first metal is removed from being over the source/drain regions that are adjacent the gate constructions of the first set and the first metal remains covering over the source/drain regions that are adjacent the gate constructions of the second set. A second metal is formed over the first metal that covers over the source/drain regions that are adjacent the gate constructions of the second set and over the source/drain regions that are adjacent the gate constructions of the first set. The second metal is of different composition from that of the first metal. The substrate is subjected to conditions which react the second metal with the silicon of the activated source/drain regions that are adjacent the gate constructions of the first set to form metal silicide-comprising contacts thereto yet which do not form metal silicide-comprising contacts with the first metal and the silicon of the source/drain regions that are adjacent the gate constructions of the second set. After forming the metal silicide-comprising contacts, the first metal, the second metal and the metal silicide-comprising contacts are subjected to an etching chemistry that etches at least some remaining of the first and second metals from the substrate selectively relative to the metal silicide-comprising contacts.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming metal silicide-comprising material, comprising:
    forming a substrate comprising a first stack comprising second metal over first metal over silicon and a second stack comprising second metal over silicon, the first and second metals being of different compositions, there being none of the first metal in the second stack; and
    subjecting the substrate to conditions which react the second metal with the silicon in the second stack to form metal silicide-comprising material from the second stack, the first metal between the second metal and the silicon in the first stack precluding formation of a silicide comprising the second metal and silicon from the first stack.

2. The method of claim 1 wherein the first metal comprises at least one of titanium nitride, molybdenum nitride, and tungsten nitride.

3. The method of claim 2 wherein the metal nitride comprises titanium nitride.

4. The method of claim 1 wherein the second metal comprises at least one of cobalt or nickel.

5. A method of forming metal silicide-comprising material, comprising:
    forming a substrate comprising a first stack comprising second metal over first metal over silicon and a second stack comprising second metal over silicon, the first and second metals being of different compositions;
    subjecting the substrate to conditions which react the second metal with the silicon in the second stack to form metal silicide-comprising material from the second stack, the subjecting the substrate to the conditions not forming a silicide comprising the second metal and silicon from the first stack; and
    after forming the metal silicide-comprising material, subjecting the first metal, the second metal and the metal silicide-comprising material to an etching chemistry that etches at least some remaining of the first and second metals from the substrate selectively relative to the metal silicide-comprising material.

6. The method of claim 5 wherein at least some of the first metal in the first stack is directly against the silicon.

7. The method of claim 5 wherein the first metal in the first stack is not directly against the silicon, and comprising a dielectric between the first metal and the silicon in the first stack.

8. The method of claim 5 wherein at least some of the second metal in the second stack is directly against the silicon.

9. The method of claim 5 wherein the second metal in the second stack is not directly against the silicon.

10. The method of claim 5 wherein at least some of the second metal is directly against the first metal in the first stack.

11. The method of claim 5 wherein the second metal is not directly against the first metal in the first stack.

12. The method of claim 5 wherein the subjecting the substrate to conditions does not form any metal silicide from materials of the first stack.

13. A method of forming metal silicide-comprising contacts, comprising:
    forming a first metal over silicon of a substrate;
    removing at least some of the first metal from being over the silicon in first substrate area where metal silicide-comprising contacts are to be formed with the silicon and leaving the first metal covering over the silicon in second substrate area where metal silicide-comprising contacts are not to be formed with the silicon;
    forming a second metal over the first metal in the second substrate area and over the silicon in the first substrate area, the second metal being of different composition from that of the first metal; and
    subjecting the substrate to conditions which react the second metal with the silicon in the first substrate area to form metal silicide-comprising contacts in the first substrate area yet which do not form metal silicide-comprising contacts with the first metal and the silicon in the second substrate area.

14. The method of claim 13 wherein the subjecting of the substrate to the conditions does not form any metal silicide with the silicon in the second substrate area.

15. The method of claim 13 wherein the removing removes all the first metal from being over the silicon in the first substrate area.

16. The method of claim 13 comprising a dielectric between the first metal and the silicon.

17. The method of claim 13 wherein the silicon over which the first and second metals are formed comprises an activated transistor source/drain region.

18. A method of forming metal silicide-comprising contacts to transistor source/drain regions, comprising:
    forming transistor gate constructions;
    forming silicon-comprising source/drain regions operatively adjacent the respective gate constructions;
    forming a first metal over the source/drain regions that are adjacent the gate constructions;
    removing the first metal from being over the source/drain regions that are adjacent some of the gate constructions and leaving the first metal covering over the source/drain regions that are adjacent other of the gate constructions;
    forming a second metal over the first metal that covers over the source/drain regions that are adjacent the some gate constructions and over the source/drain regions that are adjacent the other gate constructions, the second metal being of different composition from that of the first metal; and subjecting the substrate to conditions which react the second metal with the silicon of the source/drain regions that are adjacent the other gate constructions to form metal silicide-comprising contacts thereto yet which do not form metal silicide-comprising contacts with the first metal and the silicon of the source/drain regions that are adjacent the some gate constructions.

19. The method of claim 18 comprising after forming the metal silicide-comprising contacts, subjecting the first metal, the second metal and the metal silicide-comprising contacts to an etching chemistry that etches at least some remaining of the first and second metals from the substrate selectively relative to the metal silicide-comprising contacts.

20. A method of forming metal silicide-comprising contacts to transistor source/drain regions, comprising:

forming first and second sets of laterally spaced transistor gate constructions, immediately adjacent gate constructions of the first set being spaced farther apart than immediately adjacent gate constructions of the second set;

forming silicon-comprising source/drain regions operatively adjacent the respective gate constructions of the first and second sets;

forming a first metal over the source/drain regions that are adjacent the gate constructions of the first and second sets;

removing the first metal from being over the source/drain regions that are adjacent the gate constructions of the first set and leaving the first metal covering over the source/drain regions that are adjacent the gate constructions of the second set;

forming a second metal over the first metal that covers over the source/drain regions that are adjacent the gate constructions of the second set and over the source/drain regions that are adjacent the gate constructions of the first set, the second metal being of different composition from that of the first metal; and subjecting the substrate to conditions which react the second metal with the silicon of the source/drain regions that are adjacent the gate constructions of the first set to form metal silicide-comprising contacts thereto yet which do not form metal silicide-comprising contacts with the first metal and the silicon of the source/drain regions that are adjacent the gate constructions of the second set.

21. The method of claim 20 wherein the first metal layer is formed thicker over the source/drain regions that are between immediately adjacent of the gate constructions of the second set than over the source/drain regions that are adjacent the gate constructions of the first set.

22. The method of claim 1 wherein the second metal is closer to the silicon in the second stack than it is in the first stack.

23. The method of claim 1 wherein the second stack comprises fewer number of different composition materials than the first stack.

24. The method of claim 1 wherein the second metal in the second stack at least one of a) is directly against the silicon, and b) has dielectric material from about 0.5 nanometer to about 10 nanometers thick between the second metal and the silicon.

25. The method of claim 24 wherein the second metal in the second stack is directly against the silicon.

26. The method of claim 24 wherein the second metal in the second stack has the dielectric material from about 0.5 nanometer to about 10 nanometers thick between the second metal and the silicon.

27. The method of claim 26 wherein none of the second metal in the second stack is directly against the silicon.

* * * * *